(12) United States Patent
Oomori et al.

(10) Patent No.: US 9,018,761 B2
(45) Date of Patent: Apr. 28, 2015

(54) SEMICONDUCTOR DEVICE

(75) Inventors: Kouji Oomori, Shiga (JP); Seishi Oida, Kyoto (JP)

(73) Assignee: Panasonic Corporation, Osaka (JP)

( * ) Notice: Subject to any disclaimer, the term of this patent is extended or adjusted under 35 U.S.C. 154(b) by 578 days.

(21) Appl. No.: 12/021,446

(22) Filed: Jan. 29, 2008

(65) Prior Publication Data

US 2008/0185721 A1 Aug. 7, 2008

(30) Foreign Application Priority Data

Feb. 6, 2007 (JP) ................................. 2007-026209

(51) Int. Cl.
*H01L 23/52* (2006.01)
*H05K 3/34* (2006.01)
*H01L 21/48* (2006.01)
(Continued)

(52) U.S. Cl.
CPC .......... *H05K 3/3436* (2013.01); *H01L 21/4853* (2013.01); *H01L 23/49816* (2013.01); *H01L 23/49838* (2013.01); *H01L 23/49866* (2013.01); *H01L 2224/48227* (2013.01); *H01L 2924/01078* (2013.01); *H01L 2924/01079* (2013.01); *H01L 2924/15311* (2013.01); *H05K 3/3463* (2013.01); *H05K 2201/094* (2013.01);
(Continued)

(58) Field of Classification Search
CPC ...................... H01L 21/4853; H01L 23/49816; H01L 23/49838; H01L 2224/48227; H01L 2924/01078; H01L 2924/15311; H05K 3/3436
USPC .......... 257/738, 767, 778, 780, E23.069, 774, 257/E29.119, E23.011, E23.067, E23.145, 257/E23.174, E21.577, E21.578, E21.585, 257/E21.586, 77, 4, 685, 692; 438/108, 613
See application file for complete search history.

(56) References Cited

U.S. PATENT DOCUMENTS 6,249,053 B1 * 6/2001 Nakata et al. ................. 257/738
6,297,553 B1 * 10/2001 Horiuchi et al. .............. 257/737
(Continued)

FOREIGN PATENT DOCUMENTS

CN 1583352 2/2005
JP 2001-144214 5/2001
(Continued)

OTHER PUBLICATIONS

English Translation of Chinese Search Report issued on Jul. 23, 2014 for the related Chinese Patent Application No. 201210347848.2.

*Primary Examiner* — Cuong Q Nguyen
*Assistant Examiner* — Yosef Gebreyesus
(74) *Attorney, Agent, or Firm* — Panasonic Patent Center

(57) ABSTRACT

A semiconductor device of the present invention includes a circuit board having a number of electrode portions on the front side and the underside, an electronic circuit element such as a semiconductor chip bonded to the electrode portions on the front side of the circuit board and composing an electronic circuit; and a plurality of ball electrodes for external connection, the ball electrodes being formed on the electrode portions on the underside of the circuit board. Of the electrode portions on the underside of the circuit board, an electrode portion on the outer periphery is formed larger than an electrode portion on the inner periphery. The plurality of ball electrodes are solder balls heated and melted on the electrode portions on the underside of the board so as to form an alloy on the interfaces, the solder balls containing tin and silver but not containing lead.

18 Claims, 7 Drawing Sheets

(51) Int. Cl.
*H01L 23/498* (2006.01)
*H01L 23/00* (2006.01)

(52) U.S. Cl.
CPC ........ *H05K 2203/0465* (2013.01); *H01L 24/48* (2013.01); *H01L 2924/01322* (2013.01)

(56) References Cited

U.S. PATENT DOCUMENTS

| | | | | |
|---|---|---|---|---|
| 6,476,331 | B1* | 11/2002 | Kim et al. | 174/261 |
| 7,652,361 | B1* | 1/2010 | Yoshida et al. | 257/686 |
| 2002/0030261 | A1* | 3/2002 | Rolda et al. | 257/685 |
| 2002/0093096 | A1* | 7/2002 | Tago et al. | 257/738 |
| 2003/0022479 | A1* | 1/2003 | Hayashida | 438/614 |
| 2003/0027377 | A1* | 2/2003 | Owens | 438/125 |
| 2003/0156969 | A1* | 8/2003 | Choi et al. | 420/560 |
| 2005/0252682 | A1* | 11/2005 | Shimoto et al. | 174/260 |
| 2006/0220220 | A1* | 10/2006 | Nakagawa et al. | 257/700 |
| 2007/0045815 | A1* | 3/2007 | Urashima et al. | 257/698 |
| 2007/0234563 | A1* | 10/2007 | Sakaguchi et al. | 29/843 |

FOREIGN PATENT DOCUMENTS

| | | |
|---|---|---|
| JP | 2004-006453 | 1/2004 |
| JP | 2004-289052 | 10/2004 |
| JP | 2006-344827 | 12/2006 |

* cited by examiner

US 9,018,761 B2

SEMICONDUCTOR DEVICE

PRIORITY DATA

The present application claims priority to Japanese Patent Application No. 2007-026209, filed Feb. 6, 2007, the entire contents of which are hereby incorporated by reference.

FIELD OF THE INVENTION

The present invention relates to a surface mount semiconductor device having ball electrodes for external connection, and a method of manufacturing the same.

BACKGROUND OF THE INVENTION

As surface mount semiconductor devices having ball electrodes for external connection, packaged semiconductor devices of BGA (Ball Grid Array), CSP (Chip Size Package) and so on are available in which semiconductor elements are electrically connected to circuit boards.

FIGS. 7A and 7B show a conventional BGA semiconductor device. A semiconductor chip (semiconductor element) 2 is die bonded on one of the surfaces of a circuit board 1 that has a circuit pattern and electrode portions on both surfaces. The semiconductor chip 2 is wire bonded with metal thin wires 3 and is molded with resin 4. Solder balls 6 are bonded to electrode portions 5 on the other surface of the circuit board 1. The bonded solder balls 6 act as external terminals (ball electrodes) to be mounted on another circuit board (Japanese Patent Laid-Open No. 2001-144214).

As materials of the solder balls 6, eutectic Sn—Pb solder materials have been conventionally used but lead-free solder materials containing no lead have been increasingly used. Unfortunately, lead-free solder materials reduce a bonding strength between the solder balls 6 and the electrode portions 5.

DISCLOSURE OF THE INVENTION

In view of the problem, an object of the present invention is to improve a bonding strength in an electrode configuration having solder balls bonded to electrode portions of a circuit board.

In order to attain the object, a bonding strength between a solder ball and a substrate electrode was examined. Consequently, it has been found that a long melting time reduces a bonding strength on a solder ball made of a lead-free solder material. Further, it has been found that a long melting time reduces the ratio of breaks in solder balls to breaks on joints but increases the ratio of breaks on interfaces with substrate electrodes, reducing the bonding strength accordingly. Therefore, it has been found that in order to improve the bonding strength, the melting time of solder balls is preferably shortened and thus cooling from substrate electrodes is particularly preferable. The present invention has been completed thus.

To be specific, a semiconductor device of the present invention, including: a circuit board having a number of electrode portions on the front side and the underside; an electronic circuit element bonded to the electrode portions on the front side of the circuit board and composing an electronic circuit; and a plurality of ball electrodes for external connection, the ball electrodes being formed on the electrode portions on the underside of the circuit board, wherein of the (plurality of) electrode portions on the underside of the circuit board, the electrode portion on the outer periphery is formed larger than the electrode portion on the inner periphery, and the plurality of ball electrodes are solder balls heated and melted on the electrode portions on the underside of the board so as to form an alloy on the interfaces, the solder balls containing tin and silver but not containing lead. The electrode portions under the solder balls on the outer periphery (that is, the electrode portions on the outer periphery) are formed larger than those on the inner periphery, thereby achieving effective cooling.

A via formed on the circuit board is preferably connected to the electrode portion on the outer periphery of the underside of the board or disposed closer to the electrode portion on the outer periphery than the electrode portion on the inner periphery.

With this configuration, the ball electrode on the electrode portion on the outer periphery has an interface strength increased based on selective suppression of an alloy component formed on the interface.

An insulating layer has uniform openings on the electrode portions on the underside of the board. Each of the electrode portions on the underside of the board has at least one side larger than a ball diameter.

When the semiconductor device is manufactured, the plurality of ball electrodes can be formed by mounting the solder balls containing tin and silver but not containing lead on the electrode portions on the underside of the board, and heating and melting the solder balls to form an alloy on the surfaces of the electrode portions, and meanwhile cooling, from the electrode portions, the solder balls having been melted on the electrode portions on the outer periphery.

In order to cool the solder balls from the electrode portions, cooling gas can be passed to the front side of the circuit board. Further, a heat sink plate can be placed on the front side of the circuit board.

DESCRIPTION OF THE EMBODIMENTS

Exemplary embodiments of the present invention will now be described in accordance with the accompanying drawings.

Figure 1A:
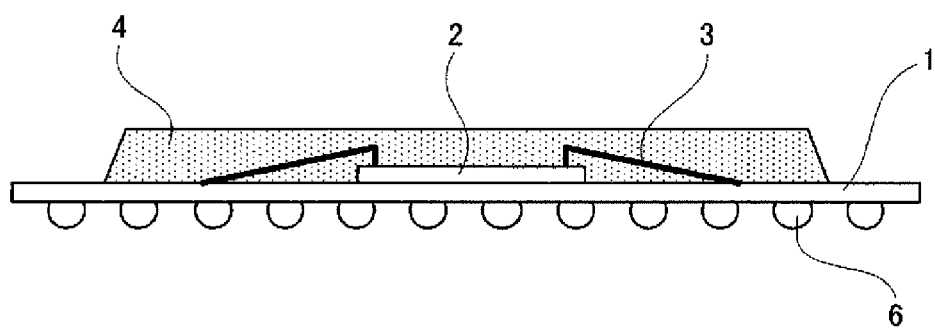
FIGS. 1A and 1B are sectional views showing the configuration of a semiconductor device according to an embodiment of the present invention.
Figure 1B:
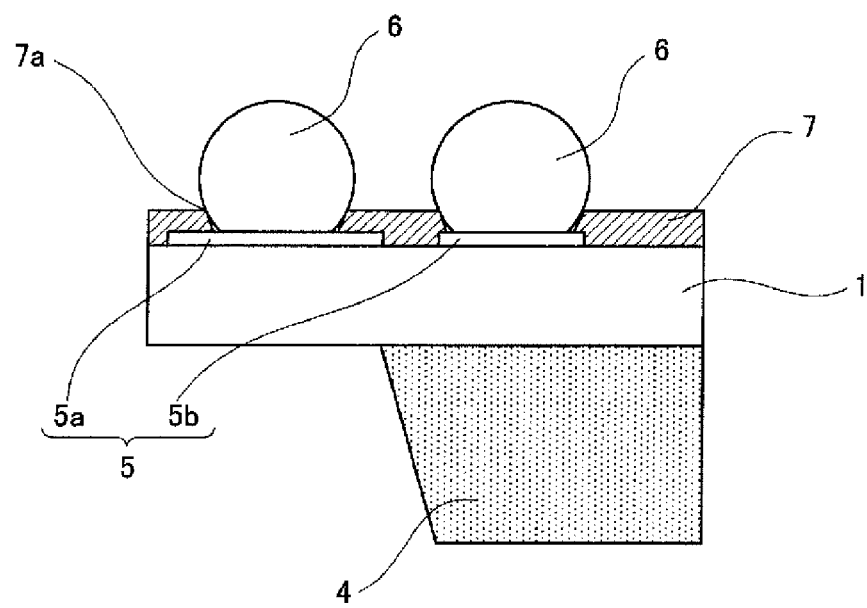

FIG. 1A is a sectional view of a BGA-type semiconductor device that is a semiconductor device of an embodiment of the present invention. FIG. 1B is a partially enlarged sectional view of the semiconductor device.

In the semiconductor device shown in FIGS. 1A and 1B, a circuit board 1 has a circuit pattern and a number of electrode portions 5 (only some of the electrode portions are shown) on both surfaces. A semiconductor element 2 is die bonded to the center of one of the surfaces (hereinafter, will be referred to as the front side) and is wire bonded with metal wires 3. Further, resin 4 for molding the semiconductor element 2 and the metal wires 3 is formed on the front side by transfer molding. On the electrode portions 5 formed on the other side (hereinafter, will be referred to as the underside) of the circuit board 1, solder balls 6 are bonded. The bonded solder balls 6 act as external terminals (ball electrodes) to be mounted to another circuit board (mounting substrate). Reference numeral 7 denotes an insulating layer.

The circuit board 1 is formed of glass epoxy serving as a base material. The electrode portions 5 on the underside of the circuit board 1 are arranged in multiple rows. An electrode portion 5a on the outer periphery of the underside has a larger area than an electrode portion 5b on the inner periphery (closer to the center of the underside). The electrode portions 5 are made of copper. A nickel coating of about 5 μm is applied to the surfaces of the electrode portions 5 and a gold coating of 0.1 μm to 1.0 μm is applied thereon. The resin 4 is formed using epoxy to cover the front side of the circuit board other than the outer edge of the circuit board. The resin 4 is not present on the back side of the electrode portion 5a but is present on the back side of the electrode portion 5b. The insulating layer 7 is made of solder resist and is so thick as to cover the electrode portions 5. On the respective surfaces of the electrode portions 5, openings 7a are formed with uniform size. On the electrode portions 5 (that is, lands) that are exposed from the openings 7a formed thus, the solder balls 6 are bonded. The solder balls 6 are made of a lead-free solder material whose main components are tin, silver and copper.

Figure 2A:
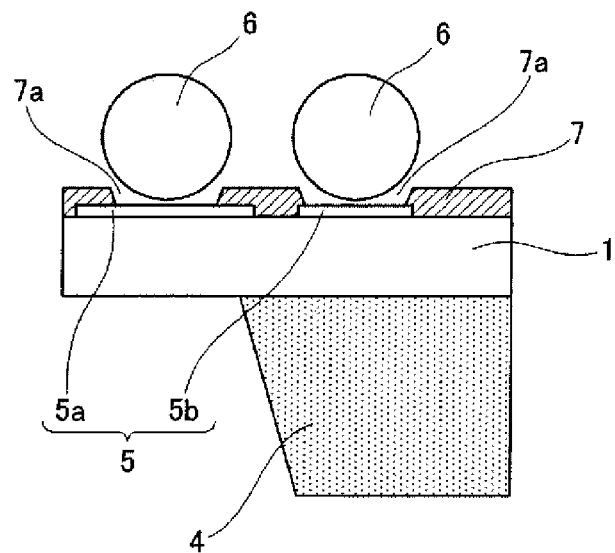
FIGS. 2A and 2B are sectional views for explaining a bonding method of solder balls and electrode portions during the manufacture of the semiconductor device shown in FIGS. 1A and 1B.
Figure 2B:
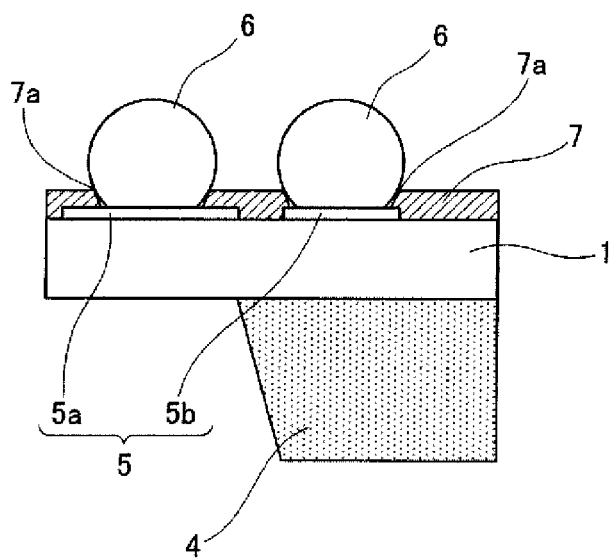

Referring to FIGS. 2A and 2B, a bonding method of the solder balls 6 will be discussed below.

As shown in FIGS. 2A and 2B, solder paste (not shown) is printed on the electrode portions 5 (5a, 5b) on the underside of the circuit board 1, the solder balls 6 are mounted thereon, and then the solder paste and the solder balls 6 are heated and melted by a reflow furnace (not shown) to alloy interfaces between the solder balls 6 and the electrode portions 5, so that the electrode portions 5 and the solder balls 6 are bonded to each other. After the completion of bonding, the flux of the solder paste is removed by cleaning.

When the heated and melted solder balls 6 are cooled to be solidified, the solder balls 6 are cooled in a cooling zone in the reflow furnace or in the atmosphere outside the reflow furnace. As described above, the electrode portions 5 (5a, 5b) are connected to the solder balls 6 via the interfaces of uniform area because the openings 7a of the insulating layer 7 have uniform size, but the electrode portion 5a on the outer periphery has a larger area than the electrode portion 5b on the inner periphery. Thus from the solder ball 6 on the electrode portion 5a on the outer periphery, heat is easily dissipated to the underside of the circuit board 1 and further to the front side of the circuit board 1 through the electrode portion 5a, so that the solder ball 6 is solidified. In other words, the solder ball 6 on the outer periphery is cooled also from the electrode portion 5a and thus is quickly solidified. Consequently, it is possible to improve the connection strengths of the interfaces as compared with the case where the solder balls 6 are cooled naturally from the outer periphery without any cooling measures, for example, the case where the area of the electrode portion 5a is equal to that of the electrode portion 5b.

For the solder balls 6 on the inner periphery of the circuit board 1, of course, similar cooling measures are preferably used. However, since heat is transmitted to the circuit board 1 through the electrode portion 5b and is easily dissipated from the resin 4 on the front side, such cooling measures are not always necessary. The solder ball 6 on the outer periphery is susceptible to an external stress and thus the cooling measures for cooling the solder ball 6 from the electrode portion 5a can more effectively improve the bonding strength. With these cooling measures, it is possible to obtain a bonding configuration with higher thermal shock resistance for the solder balls 6 on the overall circuit board 1, and prevent falling and the like of the ball electrodes.

Figure 3A:
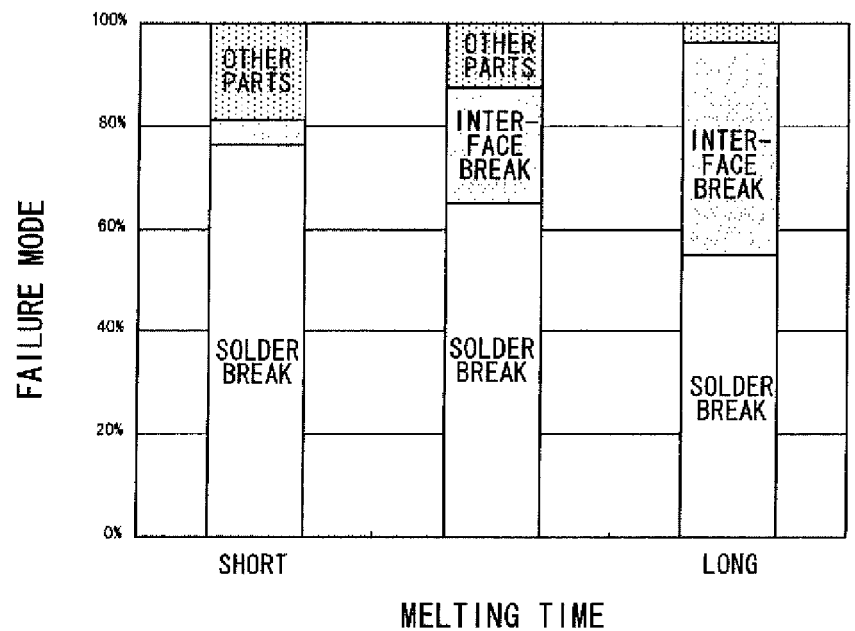
FIGS. 3A and 3B are characteristic diagrams showing bonding strengths between the solder ball and the electrode portion.
Figure 3B:
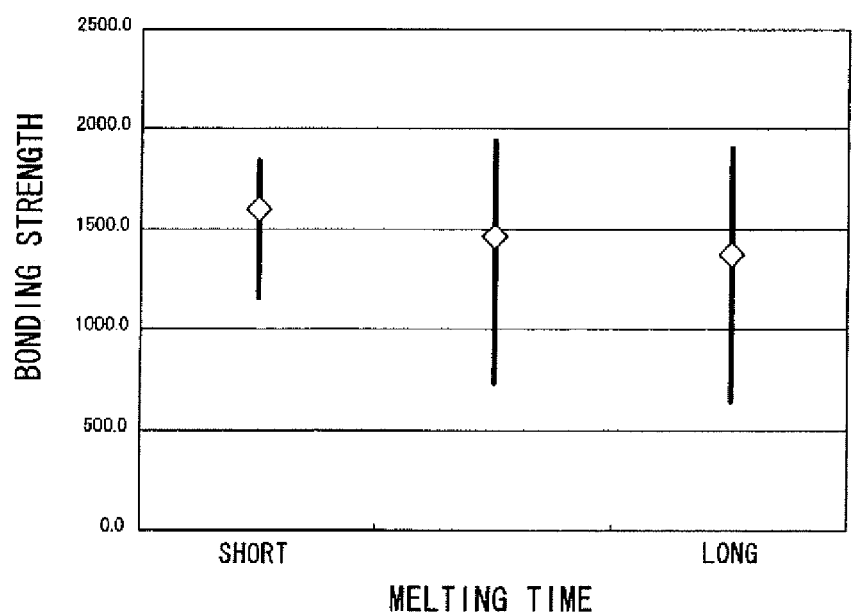

The bonding strength of the solder ball (Sn—Ag lead-free solder material) and the electrode portion was tested by a shearing force test in which a peeling force from a side of the solder ball was measured. The results are shown in FIGS. 3A and 3B. FIG. 3A is a correlation diagram of a melting time and a failure mode. FIG. 3B is a correlation diagram of a melting time and a bonding strength. In FIGS. 3A and 3B, as the melting time of the solder balls increases, the ratio of breaks in the solder balls to breaks on formed joints decreases but the ratio of breaks on the interfaces with the electrode portions increases, reducing the bonding strength accordingly. The configuration of the semiconductor device shown in FIGS. 1A and 1B can shorten the melting time of the solder balls, thereby improving the bonding strengths of the interfaces.

Further, the alloyed states of the joints with the electrode portions were examined through a cross-sectional observation in which a Sn—Ag lead-free solder material and a conventional eutectic Sn—Pb solder material were used for the solder balls. When the Sn—Pb solder material was used, a Ni—Sn alloy was formed on the interfaces between the solder balls and the electrode portions and the solder balls were bonded to the electrode portions via the alloy. On the other hand, when the Sn—Ag lead-free solder material was used, a Cu—Sn alloy was formed in addition to the Ni—Sn alloy in the alloy layers of the interfaces between the solder balls and the electrode portions. In the case of a long melting time of the solder material, a large amount of the Cu—Sn alloy was formed. It is considered that the increased amount of the Cu—Sn alloy reduces the bonding strengths of the interfaces.

Figure 4:
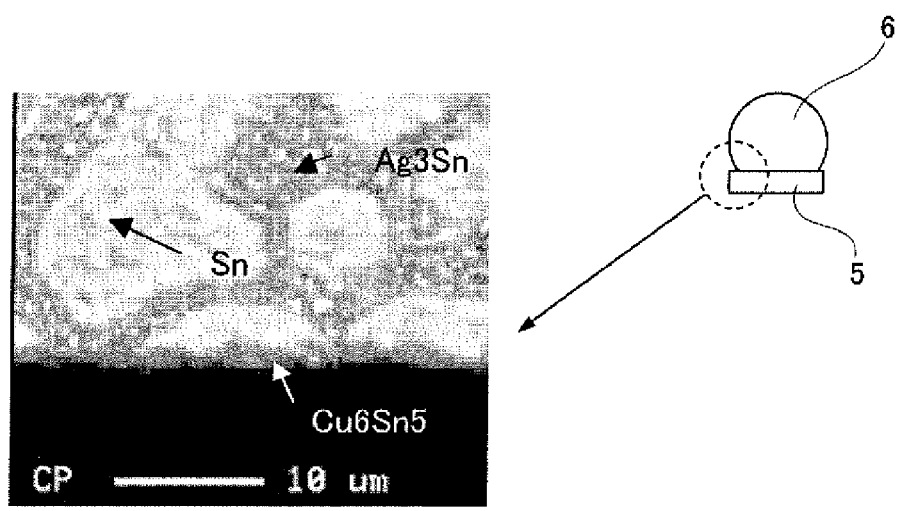
FIG. 4 shows a broken state of the solder ball and the electrode portion.

FIG. 4 is an electron micrograph (SEM) showing a broken surface of the solder ball 6 when a break occurs on the interface with the electrode portion, the solder ball being made of an Sn—Ag lead-free solder material. A Cu—Sn alloy is observed in addition to $Ag_3Sn$ but a Ni—Sn alloy is not observed. A Ni—Sn alloy (not shown) remains on the side of the electrode portion 5. The electron micrograph indicates that a break occurs between the Ni—Sn alloy and the Cu—Sn alloy when a large amount of the Cu—Sn alloy is formed on the interface.

The melting temperature of the Sn—Ag lead-free solder material is about 221° C. that is higher than about 183° C., the melting temperature of the Sn—Pb solder material, and the overall semiconductor device (resin mold) is exposed to the high temperature. Thus once the solder material is melted, it takes a long time to solidify the interface with the electrode portion through natural solidification from the outer periphery of the solder ball. In the configuration of the semiconductor device shown in FIG. 1, the solder balls are cooled and solidified also from the electrode portions. Thus the Ni—Sn alloy is formed on the interfaces with the electrode portions and the formation of the Cu—Sn alloy is suppressed.

Figure 5A:
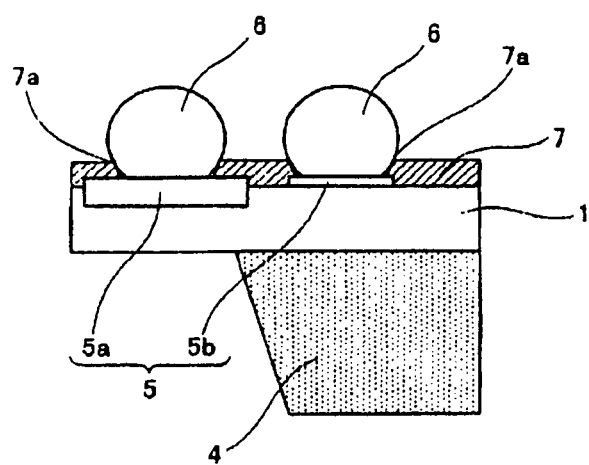
FIGS. 5A and 5B show the configuration of a semiconductor device according to another embodiment of the present invention.

In the semiconductor device of FIGS. 1A and 1B, the electrode portion 5a on the outer periphery of the circuit board 1 has a larger area than the electrode portion 5b on the inner periphery with uniform thickness. As shown in a semiconductor device of FIGS. 5A and 5B, the electrode portion 5a on the outer periphery of the circuit board 1 may have a larger thickness than the electrode portion 5b on the inner periphery with uniform area. In either case, a larger volume has greater heat dissipation.

Figure 5B:
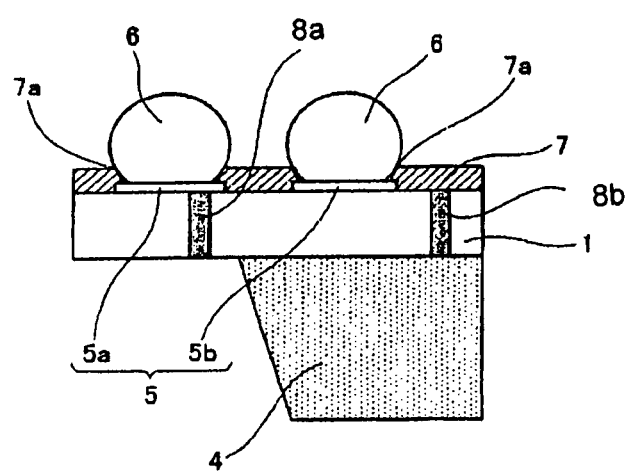

In a semiconductor device of FIG. 5B, a via 8a (may be a dummy via not electrically connected) penetrating a circuit board 1 in the thickness direction is disposed so as to be connected to the electrode portion 5a on the outer periphery of the circuit board 1 (or may be disposed close to the electrode portion 5a), so that a distance between the electrode portion 5a on the outer periphery and the via 8a is smaller than a distance between the electrode portion 5b on the inner periphery and the via 8b. With this configuration, heat can be easily dissipated from the solder balls 6 on the outer periphery through the vias 8a, 8b, achieving the aforementioned effect.

Figure 6A:
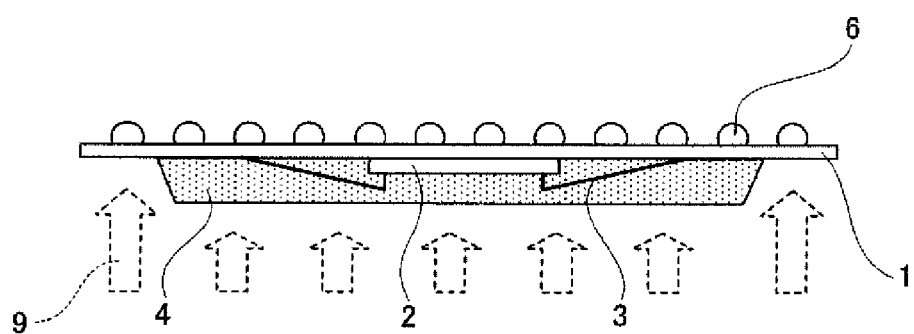
FIGS. 6A and 6B are sectional views for explaining a cooling method during the manufacture of the semiconductor device according to the present invention.

As shown in FIG. 6A, when the heated and melted solder balls 6 are solidified, the underside of the circuit board 1 and the electrode portions 5 (see FIGS. 1A and 1B) may be cooled by supplying gas such as air 9 to the front side of the circuit board 1. The air 9 has a lower temperature than the ambient temperature of the semiconductor device. In other words, the semiconductor device removed from the reflow furnace or placed in the cooling zone in the reflow furnace considerably heats a space (the atmosphere) around the semiconductor device because of the heat of the semiconductor device, and thus the semiconductor device is cooled by supplying air at room temperature or lower. Also in this cooling operation, the molten solder balls 6 can be cooled from the electrode portions 5 to suppress a reduction in interface strength as in the above explanation. Particularly the cooling effect is enhanced on the backsides of the electrode portions 5a on the outer periphery (the front side of the circuit board) because the backsides of the electrode portions 5a are not covered with the resin 4 and come into direct contact with the air 9.

Figure 6B:
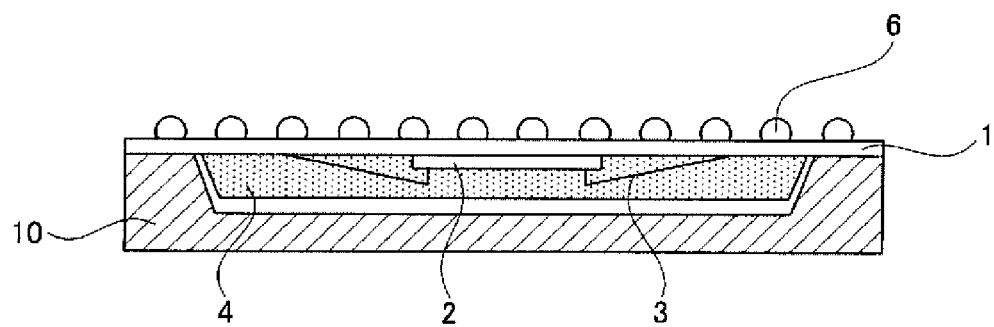
Figure 7A:
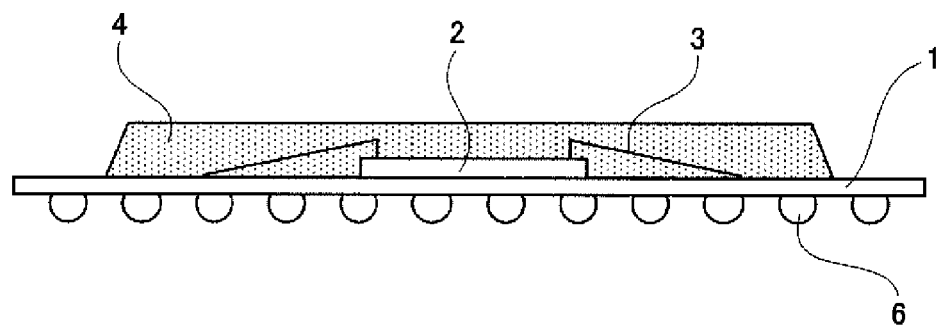
FIGS. 7A and 7B are sectional views showing a conventional semiconductor device.
Figure 7B:
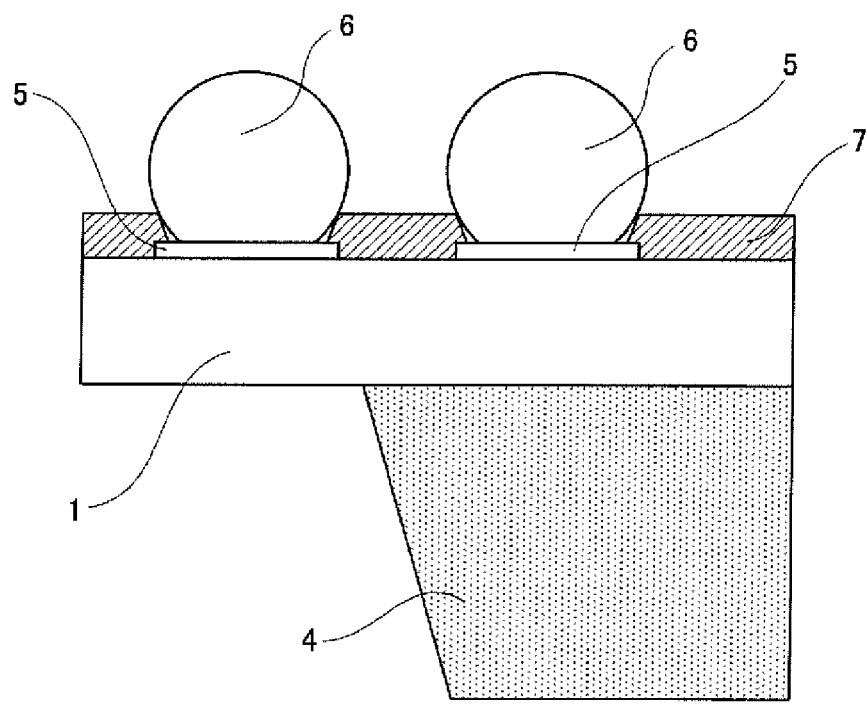

As shown in FIG. 6B, when the heated and melted solder balls 6 are solidified, the underside of the circuit board 1 and the electrode portions 5 (see FIGS. 1A and 1B) may be cooled by attaching a heat sink plate 10 made of aluminum and so on to the front side of the circuit board 1. Also in this configuration, the molten solder balls 6 can be cooled from the electrode portions 5 to suppress a reduction in interface strength as in the above explanation. Particularly the cooling effect is enhanced on the backsides of the electrode portions 5a on the outer periphery (the front side of the circuit board) because the backsides of the electrode portions 5a are not covered with the resin 4 and come into direct contact with the heat sink plate 10.

As described above, in the electrode configuration of the present invention in which the solder balls are melted and bonded to the electrode portions of the circuit board to form ball electrodes, particularly the solder balls susceptible to an external stress on the outer periphery can be cooled and solidified from electrodes. With this configuration, as compared with natural cooling from the outside of the balls, it is possible to shorten the melting time, increase connection strengths on the interfaces, and improve the thermal shock resistance. Therefore, the present invention is applicable to packaged semiconductor devices of BGA type, CSP type, and so on and is useful for preventing the fall and strength deterioration of ball electrodes.

The solder balls are cooled from the electrodes by causing the electrode portion on the outer periphery of the circuit board to have a larger size than the electrode portion on the inner periphery, disposing the via closer to the electrode portion on the outer periphery than the electrode portion on the inner periphery, passing cooling gas to the back sides of the solder balls, or attaching the heat sink plate to the back sides of the solder balls.

What is claimed is:

1. A semiconductor device, comprising:
a circuit board having a first surface and a second surface opposite to the first surface;
an electronic circuit element bonded to the first surface of the circuit board;
a resin in contact with a side surface and an upper surface of the electronic circuit element;
a plurality of electrodes disposed on the second surface, the plurality of electrodes including:
a first electrode;
a plurality of second electrodes disposed to be overlapping with the resin in a thickness direction; and
a plurality of solder balls for external connection,
wherein the plurality of solder balls includes first, second, third and fourth solder balls, the first solder ball connected to the first electrode and disposed not to overlap with the resin in the thickness direction, and the second solder ball connected to one of the plurality of second electrodes that is nearest to the first electrode,
wherein distances between neighboring ones of the first, second, third and fourth solder balls are substantially equal,
wherein on the first surface of the circuit board and overlapping with the first solder ball in the thickness direction, no metal layer connects with the electronic circuit element by a bonding member,
wherein the first electrode is larger than the one of the second electrodes in cross-sectional view.

2. The semiconductor device according to claim 1, wherein the first electrode connected to the first solder ball has a width larger than a diameter of the corresponding solder ball.

3. The semiconductor device according to claim 1, wherein the plurality of solder balls contain tin and silver but not lead.

4. The semiconductor device according to claim 3, wherein the plurality of solder balls further contain copper.

5. The semiconductor device according to claim 3, wherein nickel plating and gold plating are formed on the plurality of electrodes.

6. The semiconductor device according to claim 5, wherein an interface of the electrode and the solder ball is alloyed.

7. The semiconductor device according to claim 3, wherein the first electrode connected to the first solder ball has a width larger than a diameter of the corresponding solder ball.

8. The semiconductor device according to claim 3, further comprising an insulating layer having openings so that the first electrode and the plurality of second electrodes are exposed from the insulating layer through the openings on the second surface of the circuit board.

9. The semiconductor device according to claim 8, wherein the first electrode and the plurality of second electrodes connects to the plurality of solder balls at the exposed portions, and a part of each of the solder balls is disposed in each of the openings, respectively.

10. The semiconductor device according to claim 1, wherein nickel plating and gold plating are formed on the plurality of electrodes.

11. The semiconductor device according to claim 1, wherein the first electrode, at all of the portion connected to the solder ball, is disposed completely outside of the edge of the resin in cross-sectional view.

12. The semiconductor device according to claim 1, further comprising an insulating layer having openings so that the first electrode and the plurality of second electrodes are exposed from the insulating layer through the openings on the second surface of the circuit board.

13. The semiconductor device according to claim 12, wherein the first electrode and the plurality of second electrodes connects to the plurality of solder balls at the exposed portions, and a part of each of the solder balls is disposed in each of the openings, respectively.

14. The semiconductor device according to claim 12, wherein the openings have same width in cross sectional view.

15. The semiconductor device according to claim 1, wherein the first electrode is larger than the one of the second electrodes in dimension.

16. The semiconductor device according to claim 1, wherein the first surface of the circuit board just above the one of the second electrodes is not bonded with the electronic circuit element.

17. The semiconductor device according to claim 1, wherein the first solder ball and the second solder ball have same size.

18. The semiconductor device according to claim 1, wherein the bonding member is a bonding wire.

* * * * *